US010698781B2

(12) United States Patent
Nam

(10) Patent No.: US 10,698,781 B2
(45) Date of Patent: Jun. 30, 2020

(54) SEMICONDUCTOR MEMORY MODULE, SEMICONDUCTOR MEMORY SYSTEM, AND METHOD OF ACCESSING SEMICONDUCTOR MEMORY MODULE

(71) Applicant: SAMSUNG ELECTRONICS CO., LTD., Suwon-si, Gyeonggi-Do (KR)

(72) Inventor: Hee Hyun Nam, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 15/996,482

(22) Filed: Jun. 3, 2018

(65) Prior Publication Data

US 2019/0138413 A1    May 9, 2019

(30) Foreign Application Priority Data

Nov. 8, 2017    (KR) .................. 10-2017-0148210

(51) Int. Cl.
*G06F 11/07* (2006.01)
*G06F 11/20* (2006.01)

(52) U.S. Cl.
CPC .......... *G06F 11/2094* (2013.01); *G06F 11/20* (2013.01); *G06F 2201/82* (2013.01)

(58) Field of Classification Search
CPC .................. G06F 11/2033; G06F 11/2094
USPC .............................................. 714/6.3
See application file for complete search history.

(56) References Cited

U.S. PATENT DOCUMENTS

| 8,688,901 | B2 | 4/2014 | Chiu et al. | |
|---|---|---|---|---|
| 8,694,857 | B2 | 4/2014 | Wang et al. | |
| 9,128,632 | B2 | 9/2015 | Lee et al. | |
| 9,348,518 | B2 | 5/2016 | Fields, Jr. et al. | |
| 9,449,651 | B2 | 9/2016 | Takefman et al. | |
| 9,904,611 | B1 | 2/2018 | Kim et al. | |
| 2003/0037280 | A1* | 2/2003 | Berg ................ | G06F 11/073 |
| | | | | 714/6.12 |
| 2013/0198587 | A1 | 8/2013 | Kim et al. | |
| 2014/0156911 | A1* | 6/2014 | Alcantara ........... | G06F 12/0246 |
| | | | | 711/103 |
| 2014/0195480 | A1* | 7/2014 | Talagala .............. | G06F 12/0804 |
| | | | | 707/610 |
| 2015/0363309 | A1* | 12/2015 | Lai ..................... | G06F 12/0246 |
| | | | | 711/103 |
| 2016/0299719 | A1 | 10/2016 | Liu et al. | |
| 2016/0357454 | A1 | 12/2016 | Lee et al. | |
| 2017/0075576 | A1 | 3/2017 | Cho | |
| 2017/0123991 | A1* | 5/2017 | Sela ................... | G06F 12/0246 |

(Continued)

*Primary Examiner* — Chae M Ko
(74) *Attorney, Agent, or Firm* — Volentine, Whitt & Francos, PLLC

(57) ABSTRACT

A semiconductor memory module includes a volatile memory device, a nonvolatile memory device, data buffers, and a controller. The controller outputs first data read from the volatile memory device or the nonvolatile memory device to an external device through the data buffers, and writes second data received from the external device through the data buffers in the volatile memory device or the nonvolatile memory device. The controller performs a failover operation depending on a failover request that includes fail information indicating a position of a failed data buffer among the data buffers. In the failover operation, the controller conveys third data associated with the failed data buffer to the external device through a failover data buffer among the data buffers.

20 Claims, 14 Drawing Sheets

(56) References Cited

U.S. PATENT DOCUMENTS

2017/0168931 A1 6/2017 Kim et al.
2017/0235524 A1 8/2017 Yoo et al.

* cited by examiner

SEMICONDUCTOR MEMORY MODULE, SEMICONDUCTOR MEMORY SYSTEM, AND METHOD OF ACCESSING SEMICONDUCTOR MEMORY MODULE

CROSS-REFERENCE TO RELATED APPLICATIONS

A claim for priority under 35 U.S.C. § 119 is made to Korean Patent Application No. 10-2017-0148210 filed Nov. 8, 2017, in the Korean Intellectual Property Office, the entire contents of which are herein incorporated by reference.

BACKGROUND

Embodiments of the inventive concept disclosed herein relate to a semiconductor circuit, and more particularly to a semiconductor memory module, a semiconductor memory system, and a method of accessing the semiconductor memory module.

Semiconductor memory stores data using semiconductor elements. Semiconductor memory may be generally categorized as including volatile memory such as for example dynamic random access memory or static random access memory, and nonvolatile memory such as for example flash memory, phase-change memory, ferroelectric memory, magnetic memory, resistive memory, or the like.

In general, volatile memory supports high-speed random access and is typically used as main memory of computing systems such as personal computers, servers, or workstations for example. Nonvolatile memory supports large storage capacity and is used as auxiliary storage of computing systems for example.

Currently, a great deal of research and development has been focused on storage class memory (SCM). Storage class memory currently developed is targeted for supporting both large nonvolatile storage capacity and high-speed random access. To enable compatibility with existing main memory, research and development associated with storage class memory is based on the same memory module as the dynamic random access memory.

SUMMARY

Embodiments of the inventive concepts provide a semiconductor memory module including a volatile memory device, a nonvolatile memory device, data buffers, and a controller that outputs first data read from the volatile memory device or the nonvolatile memory device to an external device through the data buffers and writes second data received from the external device through the data buffers in the volatile memory device or the nonvolatile memory device. The controller performs a failover operation based on a failover request that includes fail information indicating a position of a failed data buffer from among the data buffers. During the failover operation, the controller conveys third data associated with the failed data buffer to the external device through a failover data buffer from among the data buffers.

Embodiments of the inventive concepts provide a semiconductor memory system including a semiconductor memory module, and a memory controller that controls the semiconductor memory module. The semiconductor memory module includes a volatile memory device, a nonvolatile memory device, data buffers, and a controller that outputs first data read from the volatile memory device or the nonvolatile memory device to the memory controller through the data buffers and writes second data received from the memory controller through the data buffers in the volatile memory device or the nonvolatile memory device. The memory controller determines when at least one data buffer from among the data buffers is a failed data buffer, and the controller performs a failover operation to bypass the failed data buffer.

Embodiments of the inventive concepts further provide a method of accessing a semiconductor memory module by a memory controller. The semiconductor memory module includes a volatile memory device, a nonvolatile memory device, and data buffers. The method includes performing, by the memory controller an error position search operation on the data buffers, and when a failed data buffer is detected during the error position search operation, performing, by the controller, a failover operation including reading data stored in the nonvolatile memory device while bypassing the failed data buffer.

Embodiments of the inventive concept still further provide a semiconductor memory system including a semiconductor memory module and a memory controller. The semiconductor memory module includes a volatile memory device, a nonvolatile memory device, data buffers and a controller. The memory controller is configured to detect a failed data buffer from among the data buffers and to provide a failover request. The controller is configured to perform a failover operation including reading data from the volatile memory device or the nonvolatile memory device, and providing the data to the memory controller through a failover data buffer from among the data buffers and through non-defective data buffers from among the data buffers, responsive to the failover request. The failover data buffer provides a bypass path for data associated with the failed data buffer.

BRIEF DESCRIPTION OF THE FIGURES

The above and other objects and features of the inventive concepts will become apparent in view of the following detailed description of exemplary embodiments with reference to the accompanying drawings.

DETAILED DESCRIPTION

Below, embodiments of the inventive concepts are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
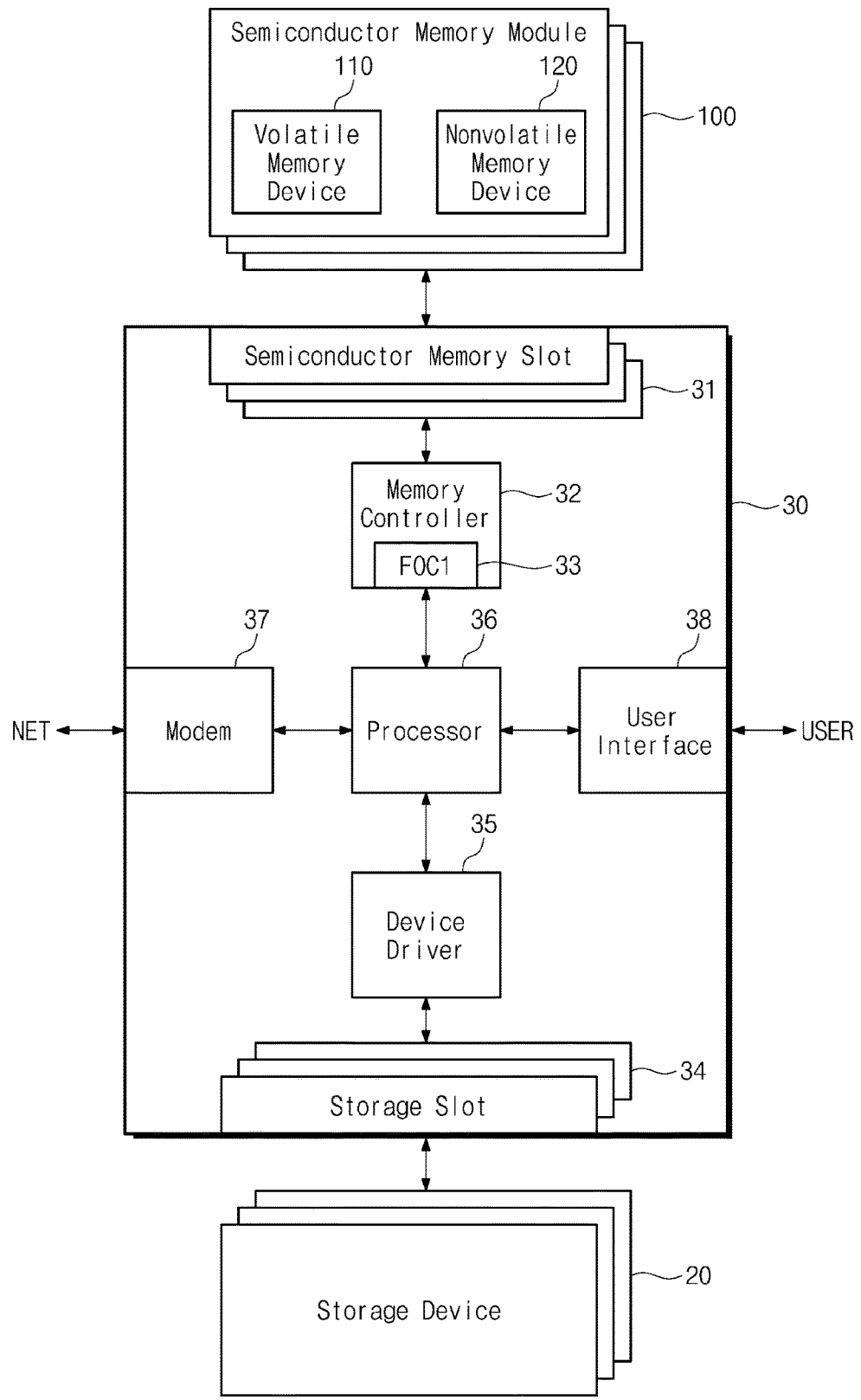
FIG. 1 illustrates a block diagram of a memory system according to an embodiment of the inventive concepts.

FIG. 1 illustrates a block diagram of a memory system 10 according to an embodiment of the inventive concepts. Referring to FIG. 1, the memory system 10 includes semiconductor memory modules 100, storage devices 20, and a host device 30. The semiconductor memory modules 100 may be used as a main memory of the host device 30.

For example, the host device 30 may store and access various codes in the semiconductor memory modules 100 needed to control the memory system 10. The host device 30 may store and access codes of an operating system or applications to be executed in the memory system 10, instances, or relevant data in the semiconductor memory modules 100.

Each of the semiconductor memory modules 100 includes a volatile memory device 110 and a nonvolatile memory device 120. The volatile memory device 110 may support a high-speed random access. The nonvolatile memory device 120 may support high-capacity nonvolatile storage. For example, the semiconductor memory modules 100 may be storage class memories.

In an embodiment, the semiconductor memory modules 100 may be homogeneous memory modules. For example, the semiconductor memory modules 100 may have the same structure. As another example, the semiconductor memory modules 100 may be heterogeneous memory modules. For example, at least one of the semiconductor memory modules 100 may only include the volatile memory device 110 or the nonvolatile memory device 120.

The storage devices 20 may be used as auxiliary storage of the host device 30. The host device 30 may store data, which is to be stored for a long time, in the storage devices 20. For example, the host device 30 may store and access in the storage devices 20 original data of an operating system or applications to be executed in the memory system 10 or data generated by the applications.

The storage devices 20 may be implemented in various forms. For example, the storage devices 20 may be implemented with one of a hard disk drive, a solid state drive, an optical disk drive or a combination of two or more thereof.

The host device 30 is configured to access the semiconductor memory modules 100 and the storage devices 20. The host device 30 includes semiconductor memory slots 31, a memory controller 32, storage slots 34, a device driver 35, a processor 36, a modem 37, and a user interface 38.

The semiconductor memory slots 31 may be configured such that the semiconductor memory modules 100 are attached thereto. The semiconductor memory slots 31 may include pins that are connectable with the semiconductor memory modules 100. For example, each of the semiconductor memory slots 31 may have dual in-line memory module (DIMM) based structure.

The memory controller 32 may access the semiconductor memory modules 100 through the semiconductor memory slots 31. Depending on a request of the processor 36, the memory controller 32 may write data in the semiconductor memory modules 100 or may read data from the semiconductor memory modules 100.

The memory controller 32 may include a first failover controller 33. When a data buffer of at least one of the semiconductor memory modules 100 physically fails, the first failover controller (FOCI) 33 may support a failover operation of reading data associated with the failed data buffer through a bypass path bypassing the failed data buffer.

The storage slots 34 may be configured such that the storage devices 20 are attached thereto. The storage slots 34 may include pins that are connectable with the storage devices 20. For example, each of the storage slots 34 may have a structure that is based on at least one of various standards such as serial advanced technology attachment (SATA), peripheral component interconnect (PCI), universal serial bus (USB), and the like.

The device driver 35 may access the storage devices 20 through the storage slots 34. For example, the device driver 35 may write or read data in or from the storage devices 20 in response to a request of the processor 36. The device driver 35 may include two or more heterogeneous drivers depending on a kind of the storage devices 20.

The processor 36 may control operations of the memory system 10. The processor 36 may execute various codes, an operating system, and applications that are needed to drive the memory system 10. The processor 36 may access the semiconductor memory modules 100 through the memory controller 32. The processor 36 may access the storage devices 20 through the device driver 35.

The processor 36 may communicate with a network NET through the modem 37. The modem 37 may communicate with the network NET through wired or wireless communication. For example, the modem 37 may support wired communication such as Ethernet, or wireless communication such as wireless-fidelity (Wi-Fi), Bluetooth, near field communication (NFC), long term evolution (LTE), or the like.

The processor 36 may communicate with a user "USER" through the user interface 38. For example, the user interface 38 may include input interfaces such as a touch pad, a touch panel, a keyboard, a mouse, a camera, a microphone, a sensor, and the like, and output interfaces such as a monitor, a speaker, a motor, and the like.

The memory system 10 is termed as a "memory system" because the memory system 10 includes the semiconductor memory modules 100. The scope and spirit of the inventive concepts however should not be limited to memory systems. For example, the memory system 10 may be included in one of various computing devices such as personal computers, servers, and workstations and the like.

There is a need to increase the storage capacity of the semiconductor memory modules 100 for the purpose of improving the performance of the memory system 10. An increase in the storage capacity of the semiconductor memory modules 100 may be accomplished by increasing the number of the semiconductor memory modules 100. However, the number of the semiconductor memory slots 31 is limited due to a practical limitation such as existing specified standards. Accordingly, an increase in the number of the semiconductor memory modules 100 is also limited.

For this reason, there is an attempt to increase a capacity of each of the individual semiconductor memory modules 100 for the purpose of increasing the capacity of the semiconductor memory modules 100 as a whole. In general, a main memory of the memory system 10 is implemented with dynamic random access memory. The capacity of the semiconductor memory modules 100 may be increased by making a capacity of dynamic random access memory larger, thereby causing a considerable increase in costs.

To increase a capacity of each of the semiconductor memory modules 100 with relatively small cost or expense, each of the semiconductor memory modules 100 may be implemented with a combination of the volatile memory device 110 and the nonvolatile memory device 120. The volatile memory device 110 that is expensive to manufacture and supports fast response speed may be used to store data that needs to be accessed with relatively fast response speed. The nonvolatile memory device 120 that is inexpensive to manufacture and supports large capacity storage may be used to store data that may be accessed with relatively slow response speed.

As another example, the volatile memory device 110 and the nonvolatile memory device 120 may be used hierarchically. For example, the volatile memory device 110 may be used as buffer memory or cache memory of the nonvolatile memory device 120. It may be possible to increase a capacity of each of the semiconductor memory modules 100 with relatively low cost by combining the volatile memory device 110 and the nonvolatile memory device 120.

For compatibility with conventional main memory, the semiconductor memory modules 100, each of which includes the volatile memory device 110 and the nonvolatile memory device 120, are designed in compliance with the same standard as the conventional main memory. For example, the semiconductor memory modules 100 may be designed in compliance with at least one of standards such as dual in-line memory module (DIMM), registered DIMM (RDIMM), and load-reduced DIMM (LRDIMM).

Figure 2:
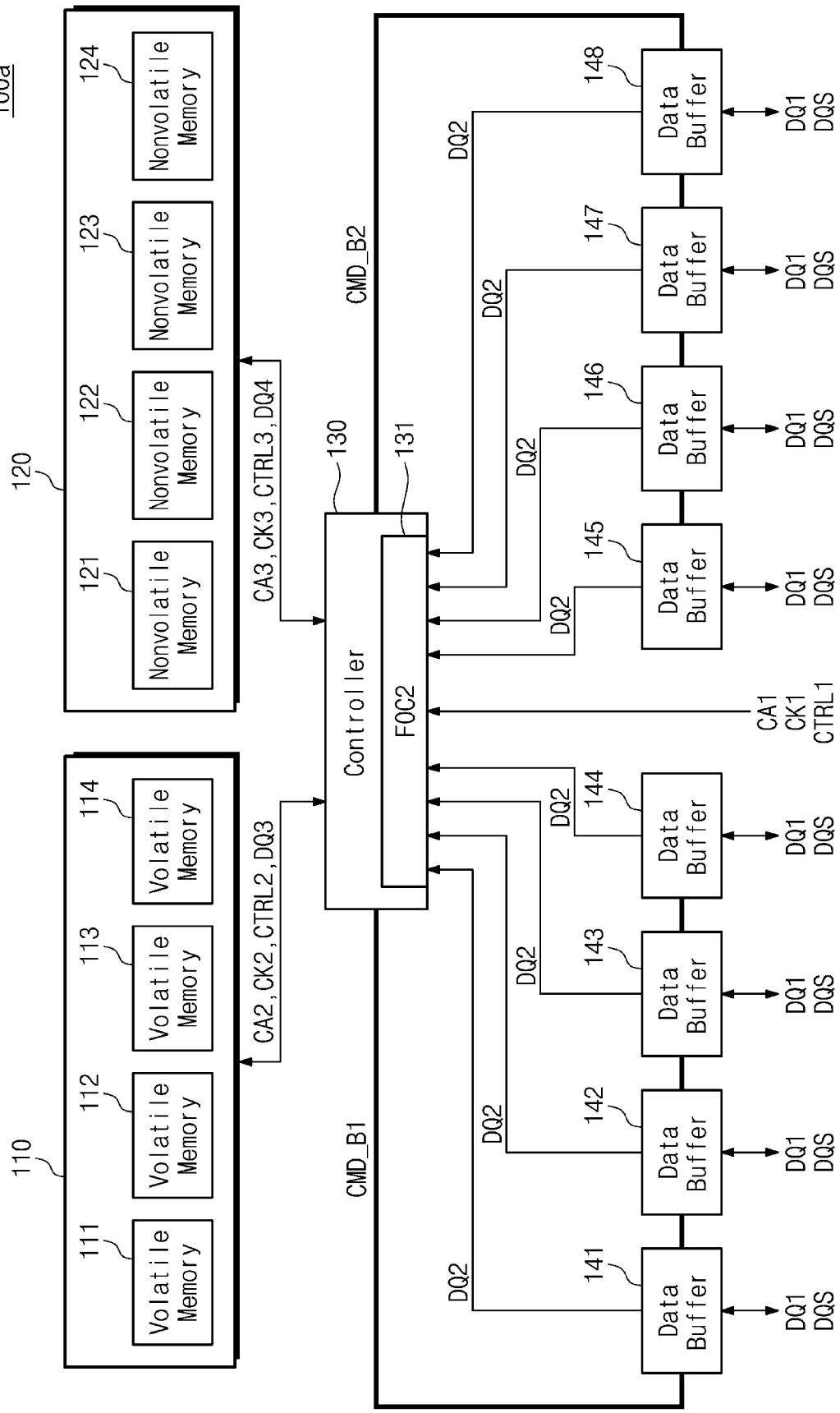
FIG. 2 illustrates a block diagram of a semiconductor memory module according to an embodiment of the inventive concepts.

FIG. 2 illustrates a block diagram of a semiconductor memory module 100a according to an embodiment of the inventive concepts. In an embodiment, the semiconductor memory module 100a designed in compliance with the LRDIMM standard is illustrated in FIG. 2. Referring to FIG. 2, the semiconductor memory module 100a includes the volatile memory device 110, the nonvolatile memory device 120, a controller 130, and first to eighth data buffers 141 to 148.

The volatile memory device 110 includes first to fourth volatile memories 111 to 114. The first to fourth volatile memories 111 to 114 may be formed of packages separated from each other. The first to fourth volatile memories 111 to 114 may include dynamic random access memories.

The nonvolatile memory device 120 includes first to fourth nonvolatile memories 121 to 124. The first to fourth nonvolatile memories 121 to 124 may be formed of packages separated from each other. As another example, the first to fourth nonvolatile memories 121 to 124 may be storage areas of the nonvolatile memory device 120, which are identified by different addresses.

The nonvolatile memory device 120 may include at least one of various nonvolatile memory devices such as flash memory devices, phase change memory devices, ferroelectric memory devices, resistive memory devices and magnetic memory devices.

The controller 130 may receive a first command and address CA1, a first clock signal CK1, and a first control signal CTRL1 from a host device (e.g., host device 30 in FIG. 1) for example. The controller 130 may exchange second data signals DQ2 with the first to eighth data buffers 141 to 148. The controller 130 may access the volatile memory device 110 or the nonvolatile memory device 120 depending on the first command and address CA1, the first clock signal CK1, and the first control signal CTRL1.

The controller 130 may transmit a second command and address CA2, a second clock signal CK2, and a second control signal CTRL2 to the volatile memory device 110, and may exchange third data signals DQ3 with the volatile memory device 110. The controller 130 may transmit a third command and address CA3, a third clock signal CK3, and a third control signal CTRL3 to the nonvolatile memory device 120, and may exchange fourth data signals DQ4 with the nonvolatile memory device 120.

In an embodiment, the first command and address CA1, the second command and address CA2, and the third command and address CA3 may have different formats. As another example, at least two of the first command and address CA1, the second command and address CA2, and the third command and address CA3 may have the same format.

For example, a format used by the controller 130 to communicate with the volatile memory device 110 may be different from a format used by the controller 130 to communicate with the nonvolatile memory device 120. The controller 130 may transmit a first buffer command CMD_B1 to control the first to fourth data buffers 141 to 144. The controller 130 may transmit a second buffer command CMD_B2 to control the fifth to eighth data buffers 145 to 148.

The first to eighth data buffers 141 to 148 may exchange first data signals DQ1 with the host device 30 in synchronization with data strobe signals DQS. The first to eighth data buffers 141 to 148 may transmit the first data signals DQ1 received from the host device 30 to the controller 130 as the second data signals DQ2.

The first to eighth data buffers 141 to 148 may transmit to the host device 30 the second data signals DQ2 received from the controller 130 as the first data signals DQ1. The first to eighth data buffers 141 to 148 may be formed of packages separated from each other.

When the first command and address CA1 or the first control signal CTRL1 indicates the volatile memory device 110, the controller 130 may convey the first command and address CA1 and the first control signal CTRL1 to the volatile memory device 110 as the second command and address CA2 and the second control signal CTRL2. The controller 130 may convey the first clock signal CK1 as the second clock signal CK2 to the volatile memory device 110, or the controller 130 may convert the first clock signal CK1 to the second clock signal CK2 and may convey the second clock signal CK2 to the volatile memory device 110.

When the first command and address CA1 indicates a write operation, the controller 130 may convey the second data signals DQ2 received from the first to eighth data buffers 141 to 148 to the volatile memory device 110 as the third data signals DQ3. When the first command and address CA1 indicates a read operation, the controller 130 may convey the third data signals DQ3 received from the volatile memory device 110 to the first to eighth data buffers 141 to 148.

In an embodiment, the controller 130 may physically associate the first to fourth volatile memories 111 to 114 and the first to eighth data buffers 141 to 148 each other. For example, the controller 130 may physically associate (or couple or connect) the first volatile memory 111 with the first and second data buffers 141 and 142. The controller 130 may convey the third data signals DQ3 for communication with the first volatile memory 111 to the first and second data buffers 141 and 142 as the second data signals DQ2.

Likewise, the controller 130 may physically associate the second volatile memory 112 with the third and fourth data buffers 143 and 144. The controller 130 may physically associate the third volatile memory 113 with the fifth and sixth data buffers 145 and 146. The controller 130 may physically associate the fourth volatile memory 114 with the seventh and eighth data buffers 147 and 148.

As another example, the controller 130 may scatter data conveyed from the first to fourth volatile memories 111 to 114 over the first to eighth data buffers 141 to 148. For example, the controller 130 may receive data to be written in a k-th volatile memory (k being a positive integer) from the first to eighth data buffers 141 to 148 in a scattering manner. The controller 130 may scatter data read from the k-th volatile memory over the first to eighth data buffers 141 to 148 so as to be output to the outside (i.e., the host 130).

When the first command and address CA1 or the first control signal CTRL1 indicates the nonvolatile memory device 120, the controller 130 may convert the first command and address CA1 and the first control signal CTRL1 to the third command and address CA3 and the third control signal CTRL3 and may convey the third command and address CA3 and the third control signal CTRL3 to the nonvolatile memory device 120.

The controller 130 may convey the first clock signal CK1 as the third clock signal CK3 to the nonvolatile memory device 120, or the controller 130 may convert the first clock signal CK1 to the third clock signal CK3 and may convey the third clock signal CK3 to the nonvolatile memory device 120. The third clock signal CK3 may be a strobe signal that toggles only when necessary in association with a command or data and does not toggle when not necessary.

When the first command and address CA1 indicates the write operation, the controller 130 may convey the second data signals DQ2 received from the first to eighth data buffers 141 to 148 to the nonvolatile memory device 120 as the fourth data signals DQ4. When the first command and address CA1 indicates the read operation, the controller 130 may convey the fourth data signals DQ4 received from the nonvolatile memory device 120 to the first to eighth data buffers 141 to 148.

In an embodiment, the controller 130 may physically associate the first to fourth nonvolatile memories 121 to 124 and the first to eighth data buffers 141 to 148 each other. For example, the controller 130 may physically associate (or couple or connect) the first nonvolatile memory 121 with the first and second data buffers 141 and 142. The controller 130 may convey the fourth data signals DQ4 for communication with the first nonvolatile memory 121 to the first and second data buffers 141 and 142 as the second data signals DQ2.

Likewise, the controller 130 may physically associate the second nonvolatile memory 122 with the third and fourth data buffers 143 and 144. The controller 130 may physically associate the third nonvolatile memory 123 with the fifth and sixth data buffers 145 and 146. The controller 130 may physically associate the fourth nonvolatile memory 124 with the seventh and eighth data buffers 147 and 148.

As another example, the controller 130 may scatter data conveyed from the first to fourth nonvolatile memories 121 to 124 over the first to eighth data buffers 141 to 148. For example, the controller 130 may receive data to be written in a k-th nonvolatile memory (k being a positive integer) from the first to eighth data buffers 141 to 148 in a scattering manner. The controller 130 may scatter data read from the k-th nonvolatile memory over the first to eighth data buffers 141 to 148 so as to be output to the outside (i.e., the host 30).

In other embodiments, the number of the volatile memories, the number of nonvolatile memories, and the number of data buffers are not limited. The number of volatile memories or nonvolatile memories may be the same as the number of data buffers. The number of data buffers may be changed to "9".

If at least one of the data buffers 141 to 148 fails (logically or physically), data written in the volatile memory device 110 or the nonvolatile memory device 120 through the failed data buffer may be lost. For example, upon reading data written through the failed data buffer, an error due to the failure of the data buffer may be present in the read data.

For example, if the error generated due to the failed data buffer is uncorrectable, it may be impossible to read a part of data stored in the nonvolatile memory device 120. That is, a part of data stored in the nonvolatile memory device 120 may be lost due to the failed data buffer. Similarly, it may be impossible to read a part of data stored in the volatile memory device 110 due to a failed data buffer.

For example, when the volatile memories 111 to 114 or the nonvolatile memories 121 to 124 are physically associated with the data buffers 141 to 148, the failure of a data buffer may further cause a problem of another aspect. For example, data written in the volatile memory device 110 or the nonvolatile memory device 120 by using a specific data buffer may be read only through the same data buffer.

In this case, it is impossible to read data of a nonvolatile memory physically associated with the failed data buffer without an error. That is, the whole data stored in a nonvolatile memory physically associated with the failed data buffer may be lost. To solve the above-described issue, the controller 130 may include a second failover controller 131. The second failover controller (FOC2) 131 may support the failover operation together with the first failover controller 33 of FIG. 1.

In the failover operation, the semiconductor memory module 100a may output data associated with the failed data buffer to the host device 30 through another data buffer (e.g., a failover data buffer), not the failed data buffer. If the failover operation is supported, data associated with the failed data buffer may be output to the host device 30 without a read error due to the failure of the data buffer. That is, data recovery and backup may be performed.

Figure 3:
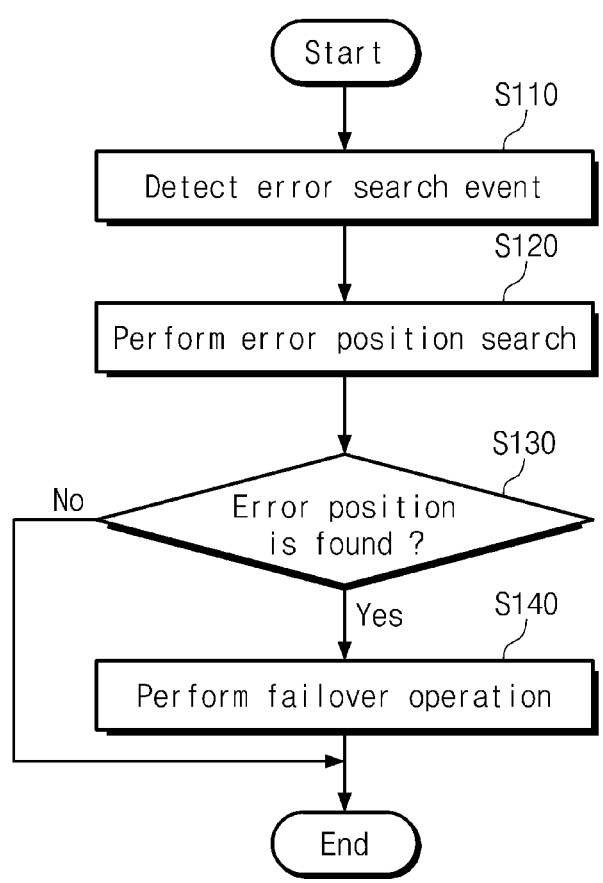
FIG. 3 illustrates a flowchart of an operation method of the memory system according to an embodiment of the inventive concepts.

FIG. 3 illustrates a flowchart of an operation method of the memory system 10 according to an embodiment of the inventive concepts. Referring to FIGS. 1 to 3, in operation S110, the memory controller 32 detects an error search event. For example, if a read error (or an uncorrectable read error) is detected upon reading data from the semiconductor memory module 100a, the memory controller 32 may determine that the error search event is detected.

As another example, when power is supplied to the host device 30 or when training with the semiconductor memory module 100a is performed, the memory controller 32 may determine that the error search event is detected. For example, the training may include a set of adjustments that the memory controller 32 performs with the semiconductor memory module 100a for the purpose of improving the reliability of data transmission.

When the error search event is detected in operation S110, thereafter in operation S120 the memory controller 32 performs an error position search operation. For example, an error position may indicate a position of the failed data buffer among the first to eighth data buffers 141 to 148. When it is determined in operation S130 that the error position is not found or detected (No in S130), that is, when the failed data buffer is absent from the data buffers 141 to 148 (i.e., a failed error buffer is not found or detected), the failover operation is not performed, and the operation ends.

When it is determined in operation S130 that the error position is found or detected (Yes in S110), the first failover controller 33 of the memory controller 32 may perform the failover operation together with the second failover controller 131 of the semiconductor memory module 100a in operation S140. For example, the semiconductor memory module 100a may bypass the failed data buffer to output data associated with the failed data buffer to the memory controller 32 through the failover data buffer.

In an embodiment, the memory controller 32 may compare the number of error positions with a threshold value in operation S140. If the number of error positions is greater than or equal to the threshold value, the memory controller 32 performs the failover operation in operation S140. If the number of error positions is smaller than the threshold value, the memory controller 32 does not perform the failover operation in operation S140.

Figure 4:
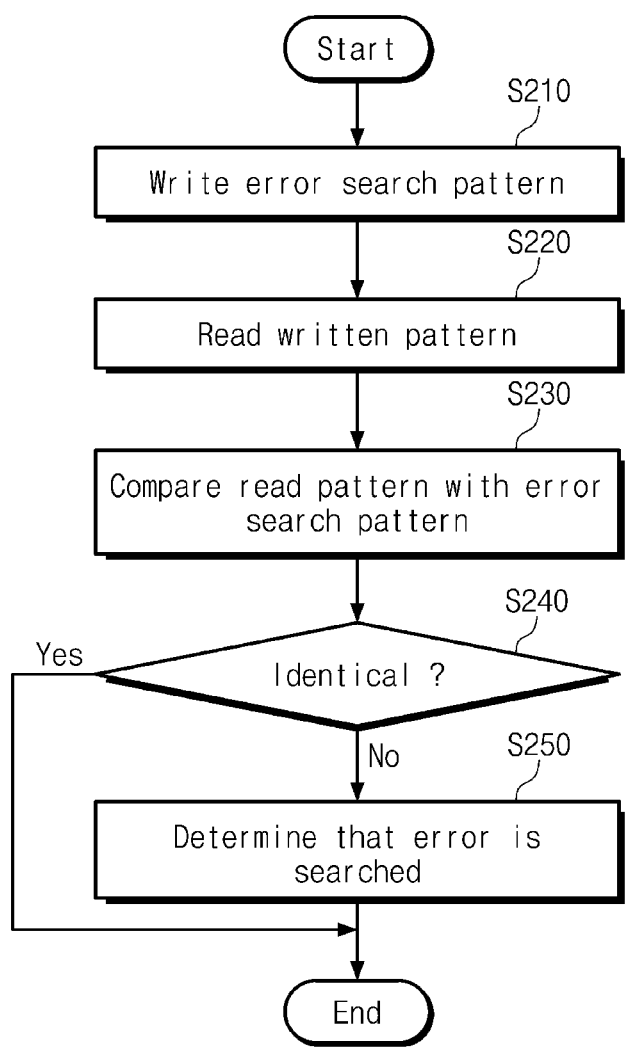
FIG. 4 illustrates a flowchart of an example in which a memory controller performs an error position search operation.

FIG. 4 illustrates a flowchart of an example in which the memory controller 32 performs an error position search operation. For example, the error position search operation described with respect to FIG. 4 may correspond to operation S120 in FIG. 3. Referring to FIGS. 1, 2, and 4, in operation S210, the memory controller 32 writes an error search pattern in the semiconductor memory module 100a. For example, the memory controller 32 may transmit the first command and address CA1 and the first control signal CTRL1 to the semiconductor memory module 100a so as to perform a first write operation. The error search pattern may be written in the volatile memory device 110 or the nonvolatile memory device 120 through the data buffers 141 to 148.

As another example, the memory controller 32 may transmit the first command and address CA1 and the first control signal CTRL1 to the semiconductor memory module 100a so as to perform a second write operation. The error search pattern may be stored in the data buffers 141 to 148 and may not be conveyed to the volatile memory device 110 or the nonvolatile memory device 120. The error search pattern may be any pattern that makes an error search operation easy. For example, the error search pattern may include a pseudo random pattern.

In operation S220, the memory controller 32 reads the pattern written in the semiconductor memory module 100a. For example, the memory controller 32 may transmit the first command and address CA1 and the first control signal CTRL1 to the semiconductor memory module 100a so as to perform a first read operation. The semiconductor memory module 100a may output the error search pattern written in the volatile memory device 110 or the nonvolatile memory device 120 to the memory controller 32 through the data buffers 141 to 148.

As another example, the memory controller 32 may transmit the first command and address CA1 and the first control signal CTRL1 to the semiconductor memory module 100a so as to perform a second read operation. The semiconductor memory module 100a may output the error search pattern stored in the data buffers 141 to 148 to the memory controller 32.

In operation S230, the memory controller 32 compares the pattern read from the semiconductor memory module 100a and the error search pattern. The memory controller 32 may compare the read pattern associated with each of the data buffers 141 and 148 and the error search pattern. When it is determined in operation S240 that a read pattern of a specific data buffer is identical with the error search pattern (Yes in S240), the memory controller 32 determines that an error is not found from (i.e., in) the specific data buffer, and the operation process ends.

When it is determined in operation S240 that the read pattern of the specific data buffer is not identical with the error search pattern (No in S240), the memory controller 32 thereafter determines in operation S250 that an error is found from (i.e., in) the specific data buffer. The memory controller 32 may determine whether an error is found from each of the data buffers 141 and 148. That is, by the comparison of the read pattern associated with each of the data buffers 141 and 148 and the error search pattern, the memory controller 32 may determine in which if any of the data buffers 141 to 148 an error is found, or in other words which if any of the data buffers 141 to 148 has failed.

For example, the memory controller 32 may repeat operation S210 to operation S250 while changing values of the error search pattern. If the number of times an error is found, or a ratio of the number of times that an error is found to a number of times an error is not found, from a specific data buffer is greater than or equal to a threshold value, the memory controller 32 may finally determine that an error is found from the specific data buffer. If the number of times or a ratio that an error is found from the specific data buffer is smaller than the threshold value, the memory controller 32 may finally determine that an error is not found from the specific data buffer.

If operation S210 to operation S250 are repeated while changing a value of the error search pattern, the failure to determine a failed data buffer due to the event that a pattern read from a failed data buffer inadvertently by chance matches with the error search pattern may be prevented. Accordingly, the probability that the memory controller 32 correctly finds a failed data buffer may become higher.

Figure 5:
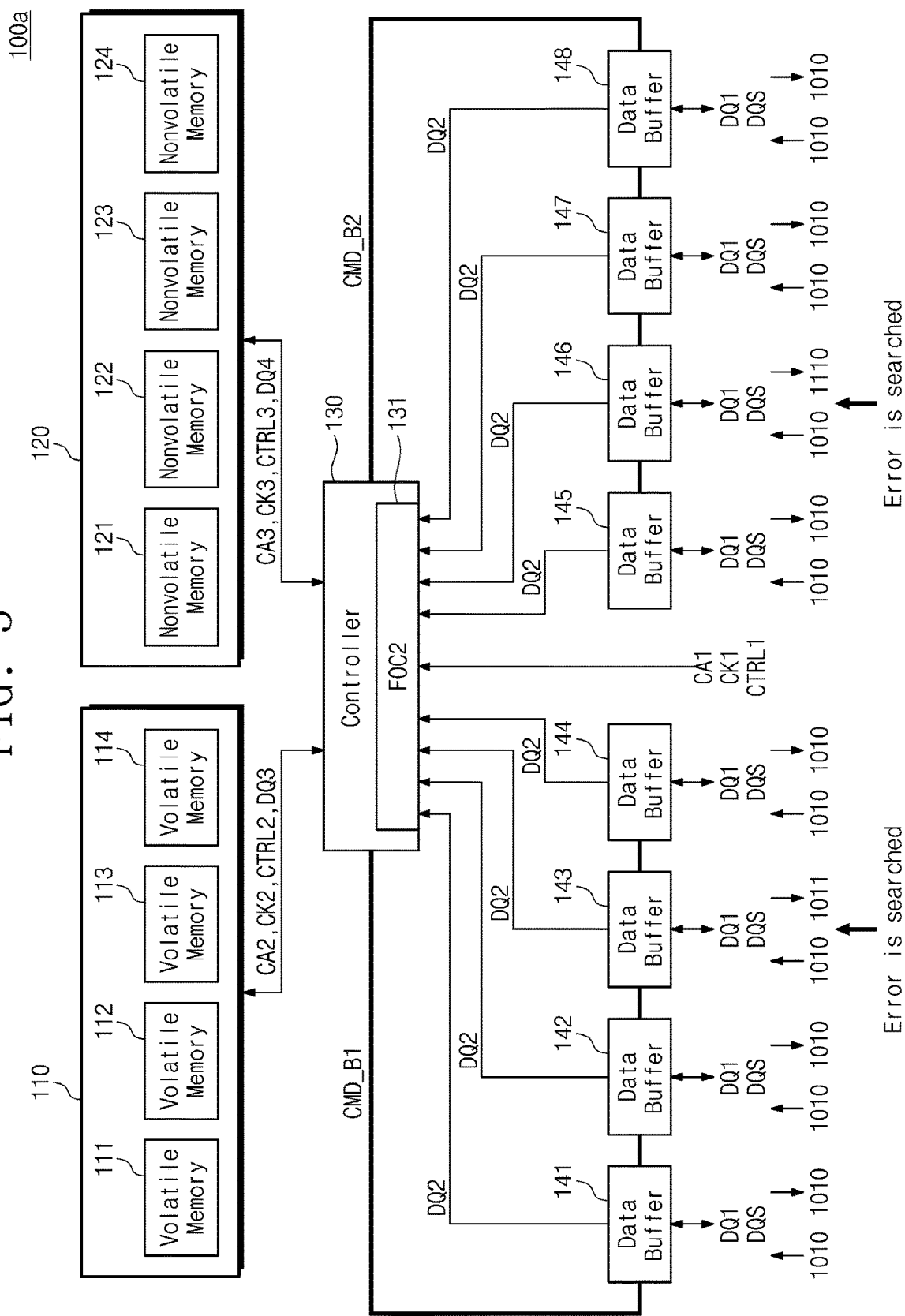
FIG. 5 illustrates an example in which an error is found in the semiconductor memory module through a method of FIG. 4.

FIG. 5 illustrates an example in which an error is found in the semiconductor memory module 100a through the method of FIG. 4. Referring to FIGS. 1 and 5, the memory controller 32 writes "1010" as an error search pattern through the first data buffer 141. The memory controller 32 reads the same pattern "1010" as the error search pattern through the first data buffer 141. Accordingly, the memory controller 32 determines that an error is not found in the first data buffer 141.

Likewise, the memory controller 32 writes "1010" as the error search pattern through each of the second, fourth, fifth, seventh, and eighth data buffers 142, 144, 145, 147, and 148. The memory controller 32 reads the same pattern "1010" as the error search pattern through each of the second, fourth, fifth, seventh, and eighth data buffers 142, 144, 145, 147, and 148. Accordingly, the memory controller 32 determines that an error is not found from (i.e., in) the second, fourth, fifth, seventh, and eighth data buffers 142, 144, 145, 147, and 148.

The memory controller 32 also writes "1010" as the error search pattern through each of the third and sixth data buffers 143 and 146. The memory controller 32 however respectively reads patterns "1011" and "1110" through the third and sixth data buffers 143 and 146, which read patterns "1011" and "1110" are different from the error search pattern. Accordingly, the memory controller 32 determine that an error is found from (i.e., in) the third and sixth data buffers 143 and 146.

An example is described in FIG. 5 in which the same error search pattern is written through the first to eighth data buffers 141 to 148. However, in other embodiments the error search patterns to be written through the first to eighth data buffers 141 to 148 may be different from each other. For example, error search patterns to be written through the first to eighth data buffers 141 to 148 may be generated by applying at least one of encoding schemes, such as inversion and circular shift, to an original pattern.

Figure 6:
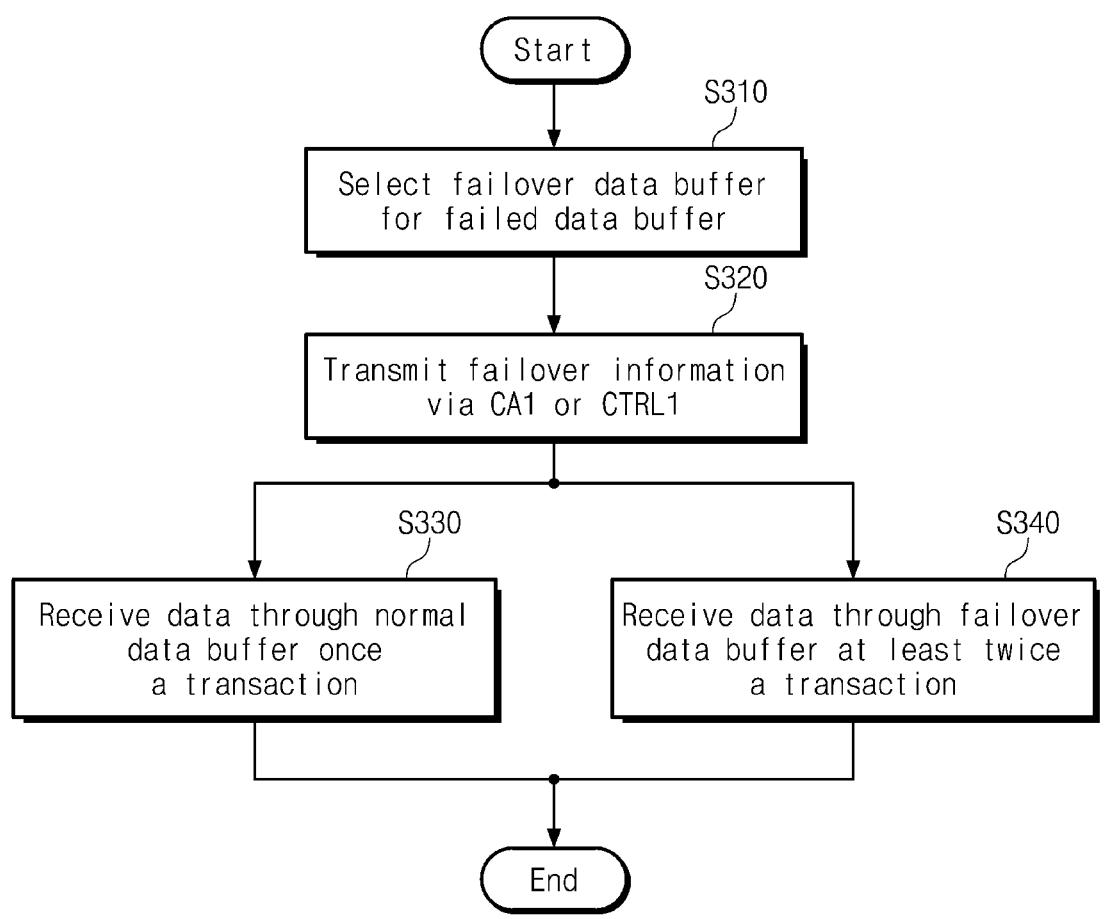
FIG. 6 illustrates a flowchart of an example in which the memory controller performs a failover operation.

FIG. 6 illustrates a flowchart of an example in which the memory controller 32 performs a failover operation. For example, the failover operation described with respect to FIG. 6 may correspond to operation S140 in FIG. 3. Referring to FIGS. 1, 2, and 6, in operation S310, the first failover controller 33 selects a failover data buffer for a failed data buffer. For example, the first failover controller 33 may select at least one failover data buffer for one failed data buffer.

As another example, the first failover controller 33 may select at least one failover data buffer for two or more failed data buffers. That is, the first failover controller 33 may allow data associated with two or more failed data buffers to be read through the at least one failover data buffer.

In operation S320, the first failover controller 33 conveys failover information to the second failover controller 131 through the first command and address CA1 or the first control signal CTRL1. The failover information may include failure information indicating a failed data buffer (e.g., a position of a failed data buffer) or a failover data buffer for the failed data buffer. The failover information may be conveyed together with a failover request.

In operation S330, the memory controller 32 receives data through a normal data buffer once for each transaction. The normal data buffer indicates or corresponds to any other data buffer, not the failed data buffer or the failover data buffer. That is, a normal data buffer is a properly functioning or non-defective data buffer. The transaction indicates or corresponds to an operation cycle that is performed as the memory controller 32 transmits a read request (or any request for requiring an output of data) once to the semiconductor memory module 100a.

For example, when a specific burst length is defined between the semiconductor memory module 100a and the memory controller 32, the semiconductor memory module 100a may output data corresponding to the burst length through one data buffer, in response to one read request. The operation cycle in which data corresponding to the burst length are output may be one transaction.

In operation S340, the memory controller 32 receives data through the failover data buffer at least twice for each transaction. For example, the memory controller 32 may receive data corresponding to the burst length through the failover data buffer at least twice in response to one read request.

Data (e.g., fourth data) corresponding to one burst length may be data associated with the failover data buffer (that is, data corresponding to the burst length intended to be read through the failover data buffer responsive to the read request). Data (e.g., third data) corresponding to at least another burst length may be data associated with at least one failed data buffer (that is, data corresponding to the burst length initially intended to be read through the at least one failed data buffer responsive to the read request). The memory controller 32 may recover original data by combining data received through a normal data buffer and data received through a failover data buffer.

Figure 7:
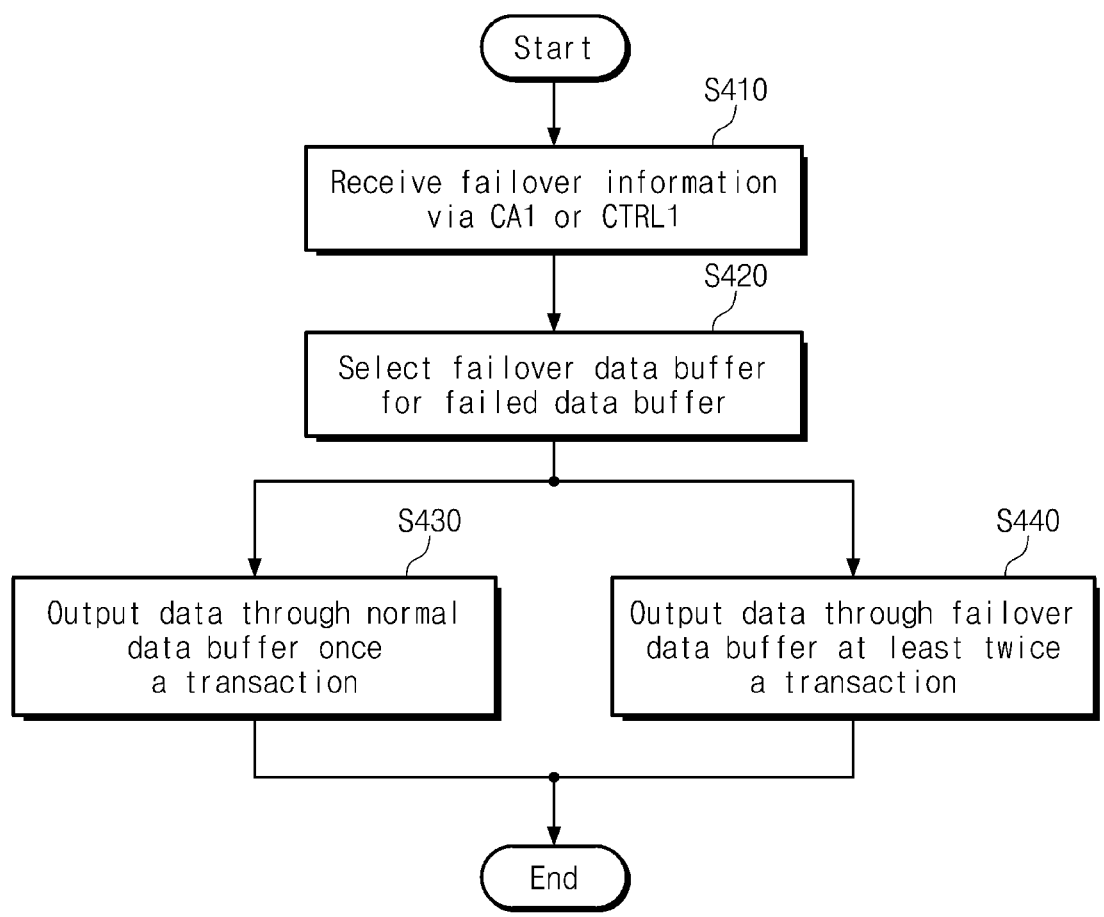
FIG. 7 illustrates a flowchart of an example in which a controller performs a failover operation.

FIG. 7 illustrates a flowchart of an example in which the controller 130 performs a failover operation. Referring to FIGS. 1, 2, and 7, in operation S410, the controller 130 receive failover information from the memory controller 32 through the first command and address CA1 or the first control signal CTRL1.

In operation S420, the second failover controller 131 selects a failover data buffer for a failed data buffer depending on the failover information. In operation S430, in response to one read request, the semiconductor memory module 100a outputs data (e.g., fifth data) stored in the volatile memory device 110 or the nonvolatile memory device 120 through a normal data buffer once for each transaction.

In operation S440, in response to one read request, the semiconductor memory module 100a outputs data stored in the volatile memory device 110 or the nonvolatile memory device 120 through a failover data buffer at least twice for each transaction. Data (e.g., fourth data) corresponding to one burst length may be data associated with the failover data buffer (that is, data corresponding to the burst length intended to be output through the failover data buffer responsive to the read request). Data (e.g., third data) corresponding to at least another burst length may be data associated with the failed data buffer (that is, data initially intended to be output through the at least one failed data buffer responsive to the read request).

Figure 8:
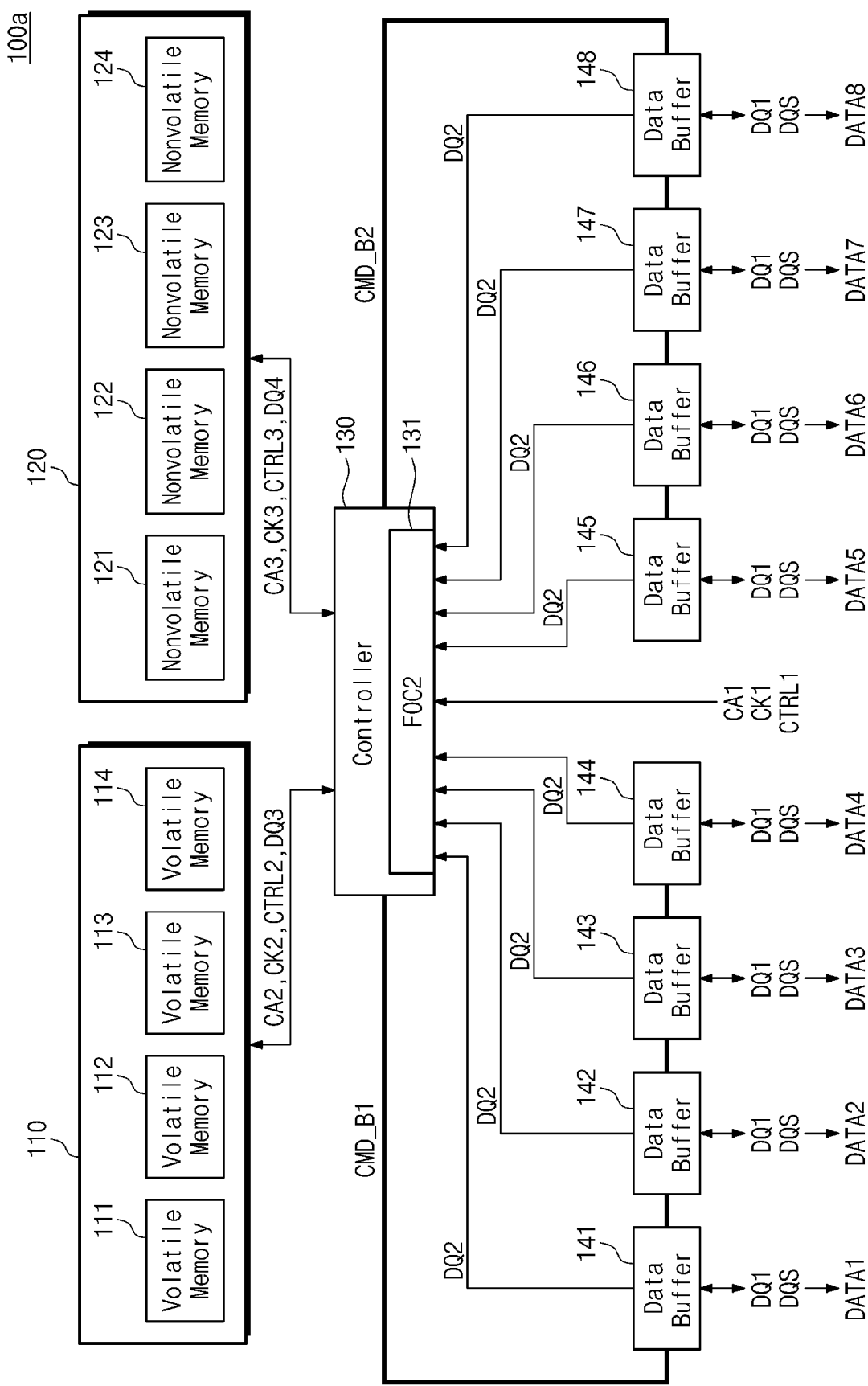
FIG. 8 illustrates an example in which the semiconductor memory module outputs data when a failed data buffer does not exist.

FIG. 8 illustrates an example in which the semiconductor memory module 100a outputs data when a failed data buffer does not exist. Referring to FIG. 8, in response to one read request, the semiconductor memory module 100a may output first to eighth data DATA1 to DATA8 stored in the volatile memory device 110 or the nonvolatile memory device 120 respectively through the first to eighth data buffers 141 to 148 during one transaction.

Figure 9:
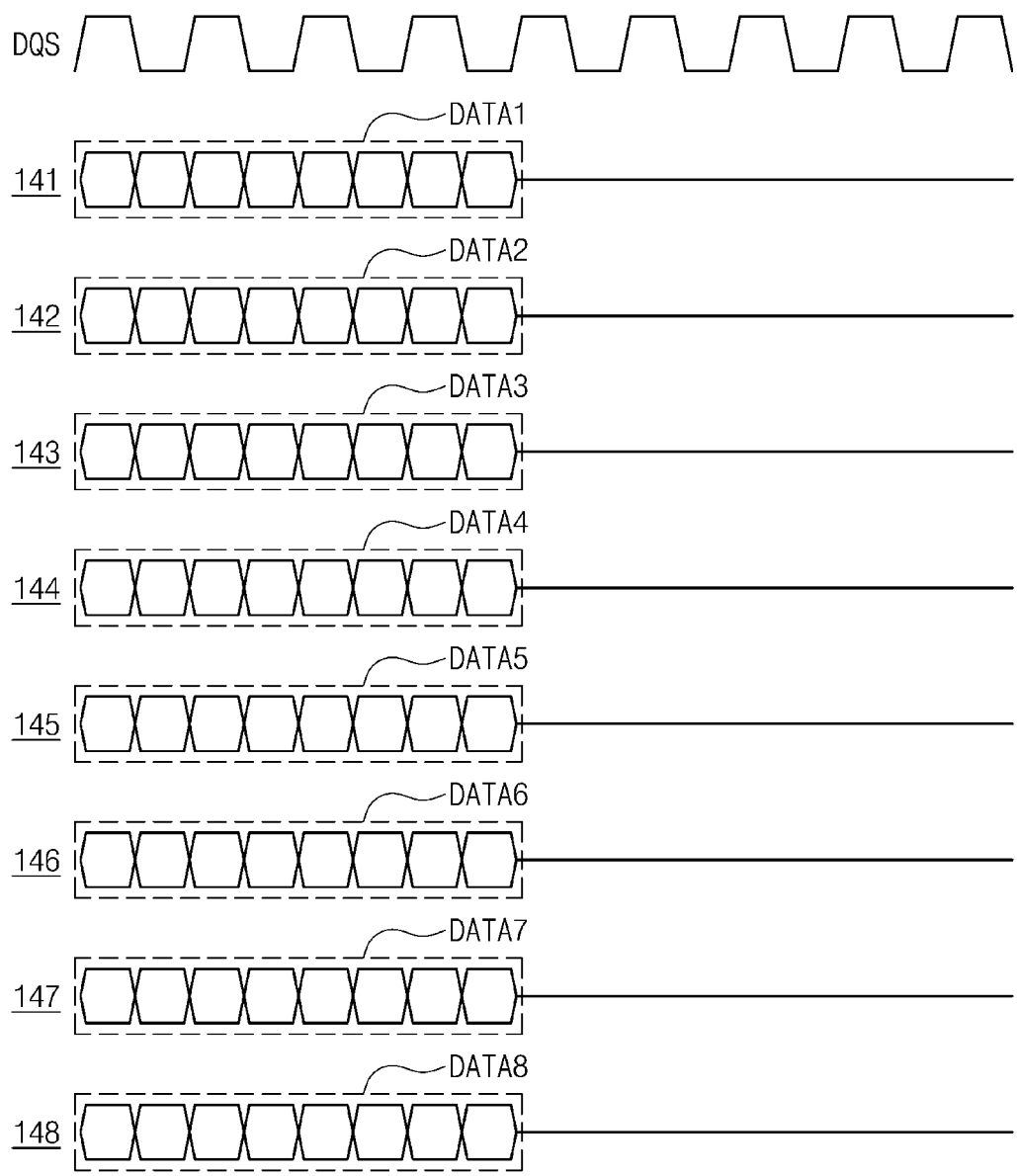
FIG. 9 illustrates a timing diagram of an example in which first to eighth data buffers output first to eighth data.

FIG. 9 illustrates a timing diagram of an example in which the first to eighth data buffers 141 to 148 output the first to eighth data DATA1 to DATA8. Referring to FIGS. 8 and 9, the first to eighth data DATA1 to DATA8 may be output in synchronization with a data strobe signal DQS. The first to eighth data DATA1 to DATA8 may have the same length. For example, the first to eighth data DATA1 to DATA8 may have the same length as a burst length.

Figure 10:
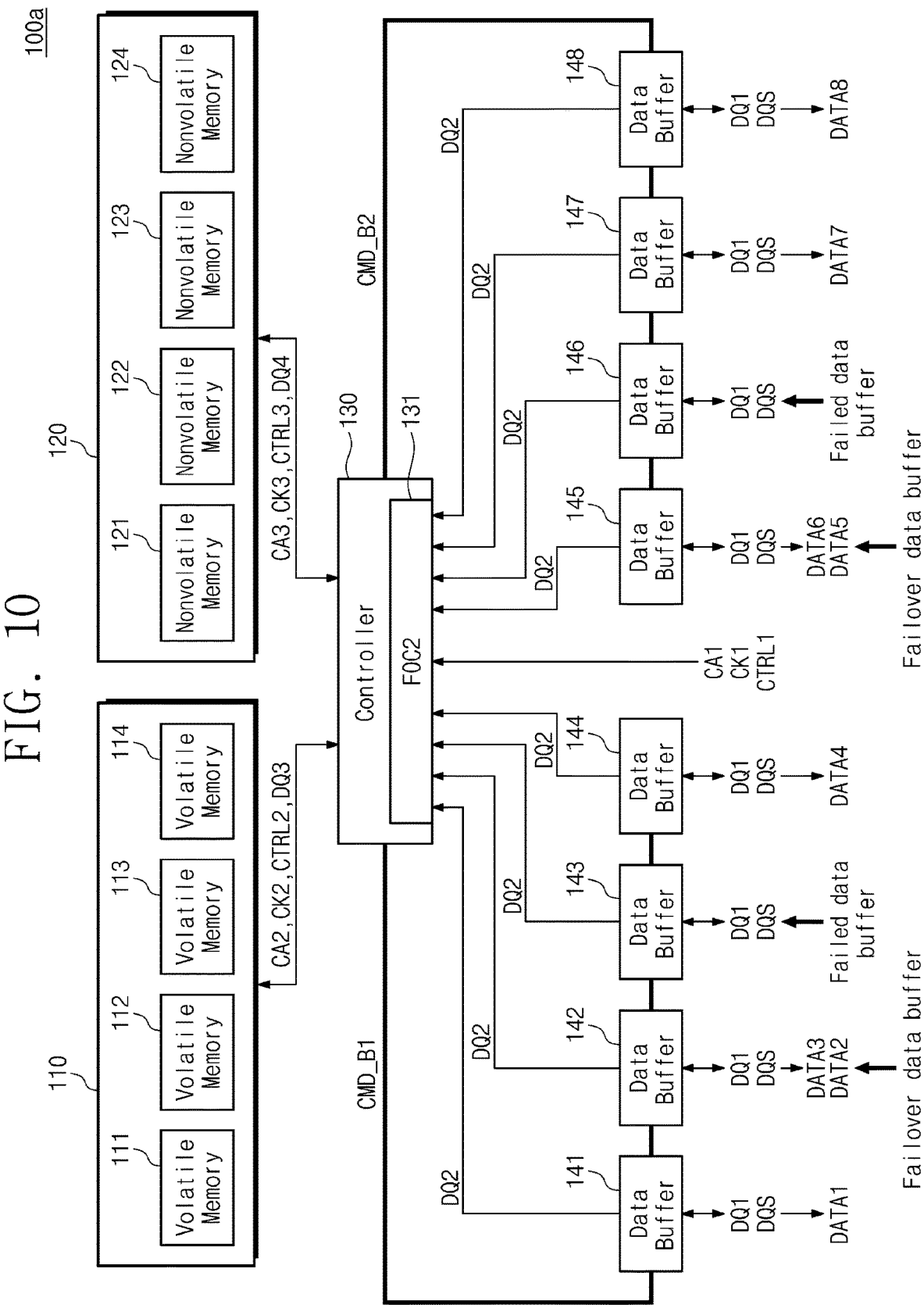
FIG. 10 illustrates an example in which the semiconductor memory module outputs data through a failover operation when third and sixth data buffers fail.

FIG. 10 illustrates an example in which the semiconductor memory module 100a outputs data through a failover operation when the third and sixth data buffers 143 and 146 fail. Referring to FIG. 10, the third data buffer 143 has failed, and the second data buffer 142 is selected as a failover data buffer of the third data buffer 143. Also, the sixth data buffer 146 has failed, and the fifth data buffer 145 is selected as a failover data buffer of the sixth data buffer 146.

Accordingly, in the embodiment described with respect to FIG. 10, the third and sixth data buffers 143 and 146 are failed data buffers. The first, fourth, seventh, and eighth data buffers 141, 144, 147, and 148 are normal data buffers. The second and fifth data buffers 142 and 145 are failover data buffers.

In the embodiment described with respect to FIG. 10, in response to one read request, the semiconductor memory module 100*a* outputs first, fourth, seventh, and eighth data DATA1, DATA4, DATA7, and DATA8 stored in the volatile memory device 110 or the nonvolatile memory device 120 respectively through the first, fourth, seventh, and eighth data buffers 141, 144, 147, and 148 during one transaction.

Moreover, in response to the one read request, the semiconductor memory module 100*a* outputs second and third data DATA2 and DATA3 stored in the volatile memory device 110 or the nonvolatile memory device 120 through the second data buffer 142 during one transaction.

Still further in response to the one read request, the semiconductor memory module 100*a* outputs fifth and sixth data DATA5 and DATA6 stored in the volatile memory device 110 or the nonvolatile memory device 120 through the fifth data buffer 145 during one transaction.

Figure 11:
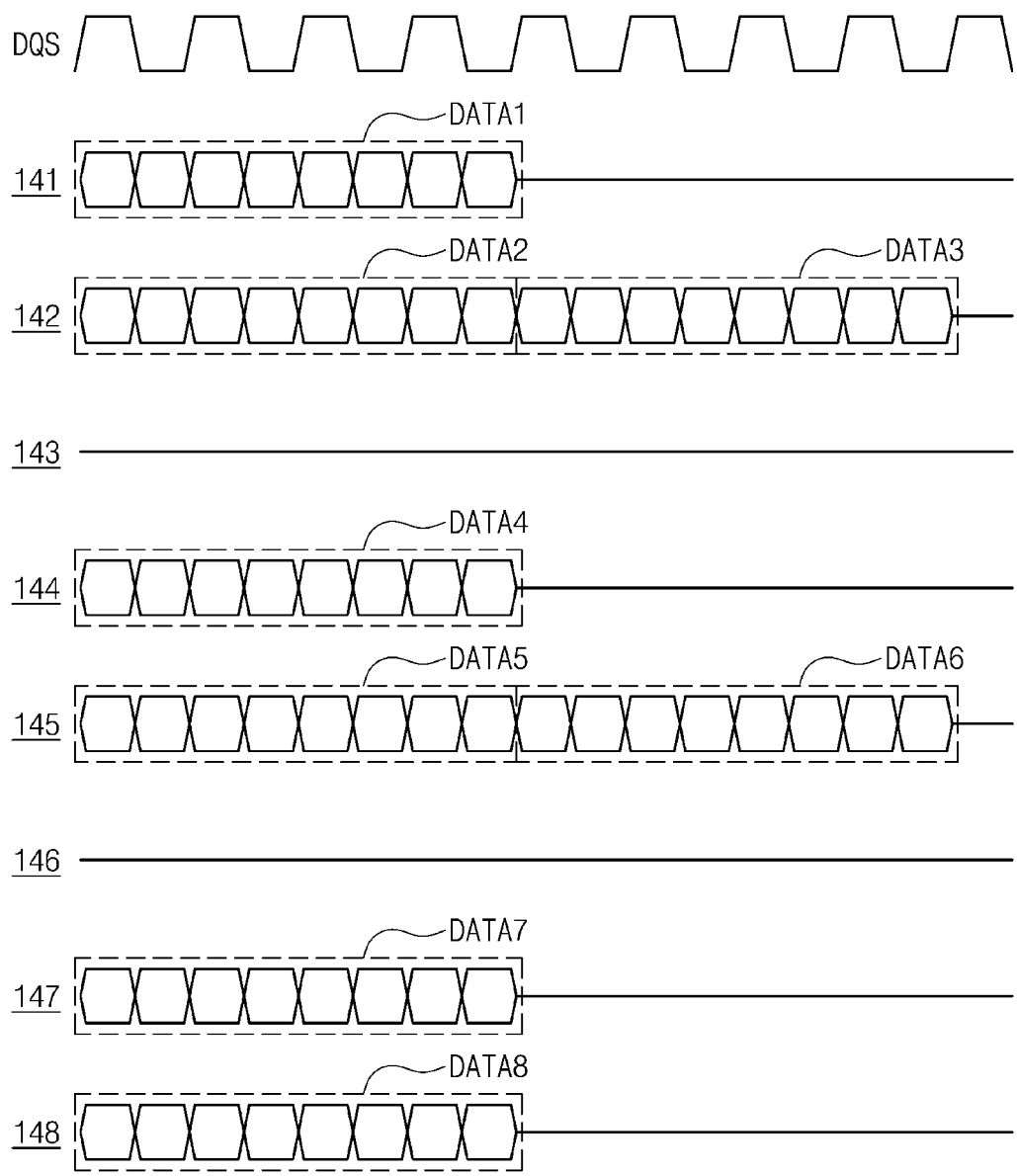
FIG. 11 illustrates a timing diagram of an example in which failover data buffers and normal data buffers of FIG. 10 output first to eighth data.

FIG. 11 illustrates a timing diagram of an example in which failover data buffers and normal data buffers of FIG. 10 output the first to eighth data DATA1 to DATA8. Referring to FIGS. 10 and 11, the first, fourth, seventh, and eighth data buffers 141, 144, 147, and 148 that are normal data buffers respectively output the first, fourth, seventh, and eighth data DATA1, DATA4, DATA7, and DATA8 corresponding to one burst length.

The second and fifth data buffers 142 and 145 that are failover data buffers respectively output the second and fifth data DATA2 and DATA5 associated with second and fifth data buffers 142 and 145 at the same time with the normal data buffers. Afterwards, the second and fifth data buffers 142 and 145 respectively output the third and sixth data DATA3 and DATA6 associated with the failed data buffers. The first, fourth, seventh, and eighth data buffers 141, 144, 147, and 148 do not output data while the third and sixth data DATA3 and DATA6 are output from the second and fifth data buffers 142 and 145. As another example, the first, fourth, seventh, and eighth data buffers 141, 144, 147, and 148 may output dummy data while the third and sixth data DATA3 and DATA6 are output.

The memory controller 32 of FIG. 1 may process the first to eighth data DATA1 to DATA8 as one data group received during one transaction. For example, the memory controller 32 may rearrange the third data DATA3 and the sixth data DATA6 to recover original data.

In an embodiment, the controller 130 may stop supplying power to the third and sixth data buffers 143 and 146 determined as failed data buffers. Since supplying power to the failed data buffers is stopped, power consumption of the semiconductor memory module 100*a*, in particular, power consumption of the failover operation may be reduced.

Figure 12:
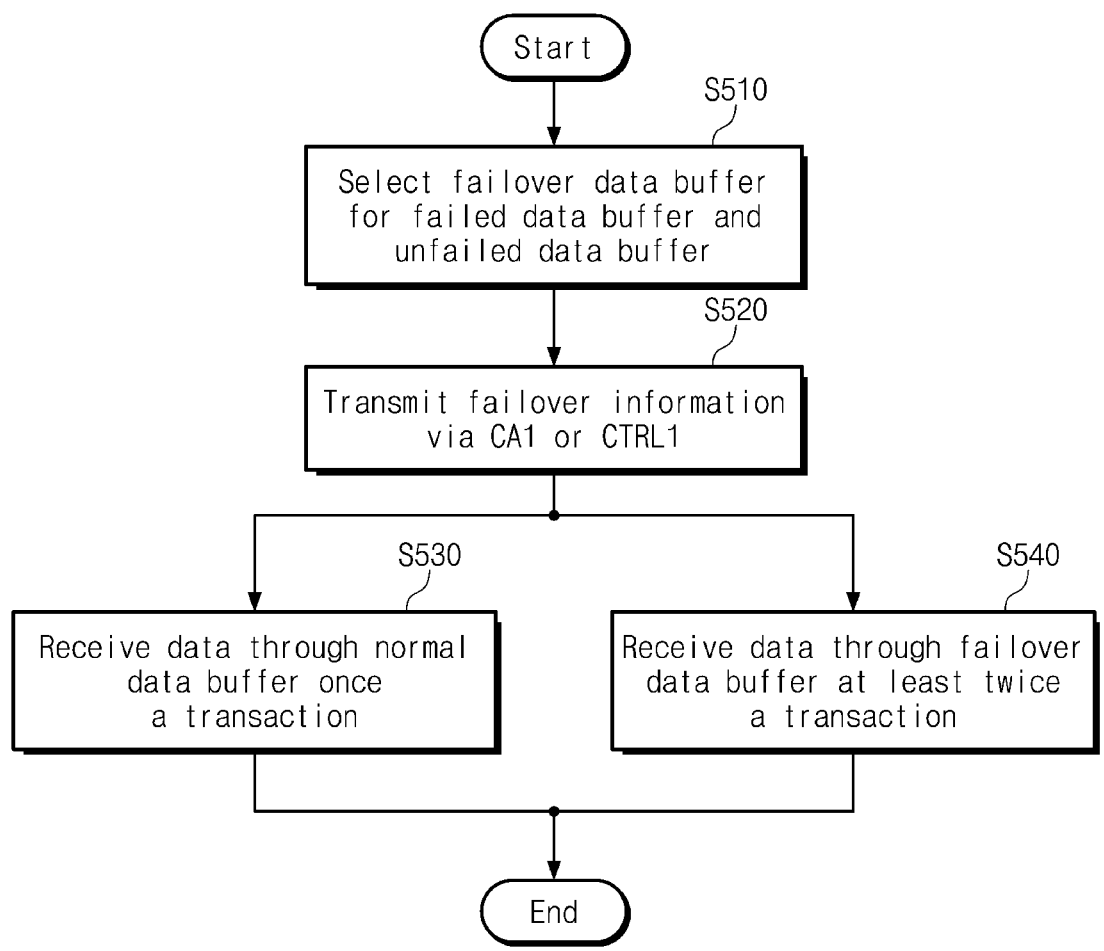
FIG. 12 illustrates a flowchart of an application in which the memory controller performs a failover operation.

FIG. 12 illustrates a flowchart of an application in which the memory controller 32 performs a failover operation. For example, the failover operation described with respect to FIG. 12 may correspond to operation S140 in FIG. 3. Referring to FIGS. 1, 2, and 12, in operation S510, the memory controller 32 selects failover data buffers for a failed data buffer and an unfailed data buffer.

For example, the memory controller 32 or the controller 130 may group the data buffers 141 to 148 for management purposes. If a data buffer belonging to a specific group fails, the memory controller 32 may select an unfailed data buffer belonging to the same group as the failed data buffer as the failover data buffer.

As another example, the memory controller 32 or the controller 130 may manage the total number of activated data buffers among the data buffers 141 to 148. For example, the memory controller 32 may manage the total number of normal data buffers and failover data buffers. For example, the memory controller 32 may manage the number of activated data buffers so as to correspond to the power of 2.

When a failed data buffer does not exist, the memory controller 32 may manage the number of activated data buffers so as to correspond to the total number of the data buffers 141 to 148. If a data buffer fails, the memory controller 32 may adjust the number of activated data buffers to a first value determined in advance. When the number of activated data buffers is adjusted to the first value, the memory controller 32 may select failover data buffers for both the failed data buffer and an unfailed data buffer.

If the number of failed data buffers increases and thus the number of activated data buffers decreases to less than the first value, the memory controller 32 may adjust the number of activated data buffers to a second value determined in advance. When the number of activated data buffers is adjusted to the second value, the memory controller 32 may select failover data buffers for both a failed data buffer and an unfailed data buffer.

Data buffers that are matched (or paired or associated) with failover data buffers even though the data buffers do not fail may not be used. The controller 130 may stop supplying power to unused data buffers. Since supplying power to the unused data buffers is stopped, power consumption of the semiconductor memory module 100*a* may be reduced.

Figure 13:
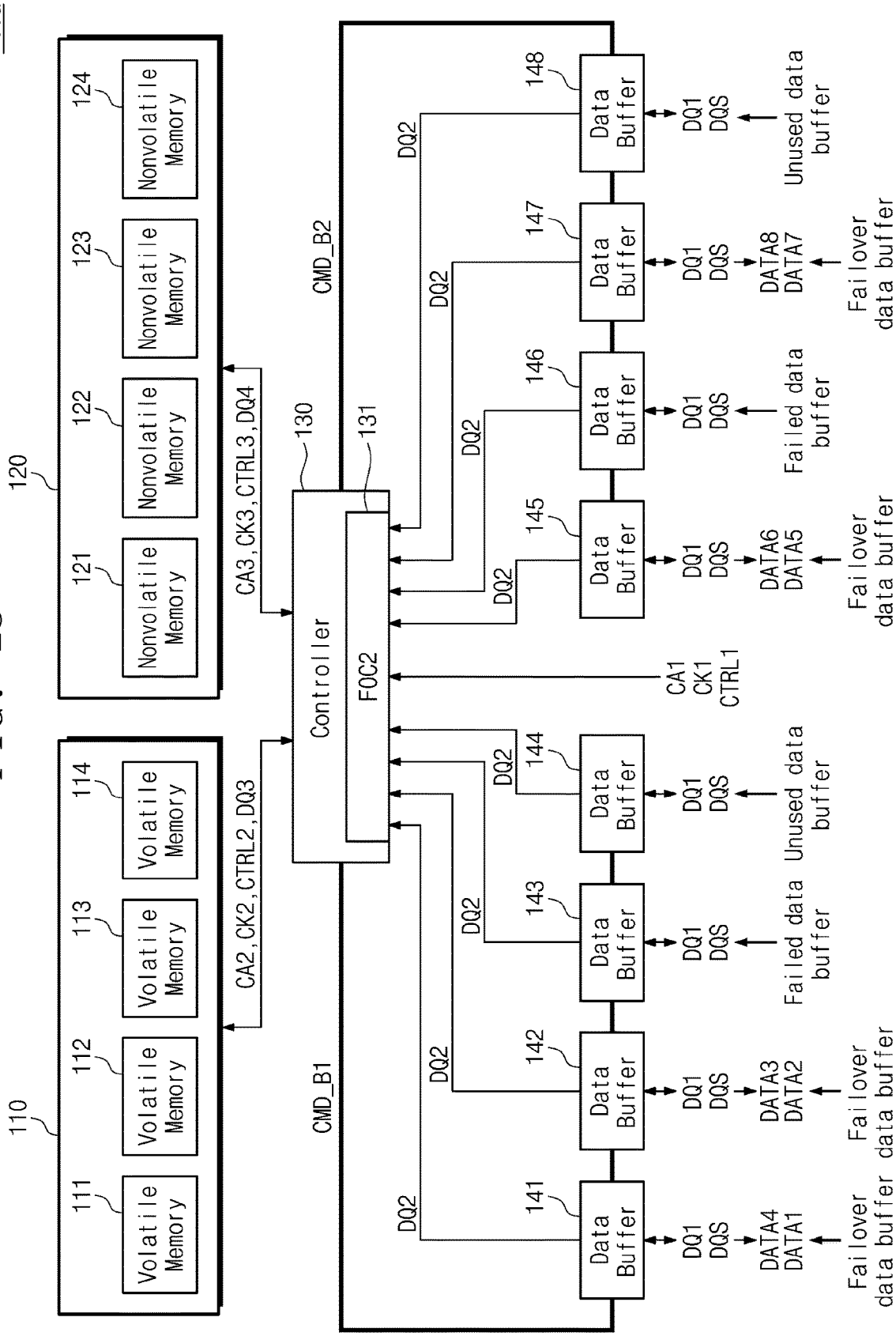
FIG. 13 illustrates an example of the semiconductor memory module, in which failover data buffers are selected according to a method of FIG. 12.

FIG. 13 illustrates an example of the semiconductor memory module 100*a*, in which failover data buffers are selected according to the method of FIG. 12. Referring to FIGS. 1, 12, and 13, the second data buffer 142 is selected as a failover data buffer for a failed data buffer (that is the third data buffer 143 which is indicated in FIG. 13 as a failed data buffer). The second data buffer 142 outputs the second data DATA2 associated with the second data buffer 142 and the third data DATA3 associated with the third data buffer 143 which is the failed data buffer.

The first data buffer 141 is selected as a failover data buffer for an unused data buffer (that is the fourth data buffer 144 which is indicated in FIG. 13 as an unused data buffer). The first data buffer 141 outputs the first data DATA1 associated with the first data buffer 141 and the fourth data DATA4 associated with the fourth data buffer 144 which is the unused data buffer.

The fifth data buffer 145 is selected as a failover data buffer for a failed data buffer (that is the sixth data buffer 146 which is indicated in FIG. 13 as a failed data buffer). The fifth data buffer 145 outputs the fifth data DATA5 associated with the fifth data buffer 145 and the sixth data DATA6 associated with the sixth data buffer 146 which is the failed data buffer.

The seventh data buffer 147 selected as a failover data buffer for an unused data buffer (that is the eighth data buffer 148 which is indicated in FIG. 13 as an unused data buffer). The seventh data buffer 147 outputs the seventh data DATA7 associated with the seventh data buffer 147 and the eighth data DATA8 associated with the eighth data buffer 148 which is the unused data buffer.

Figure 14:
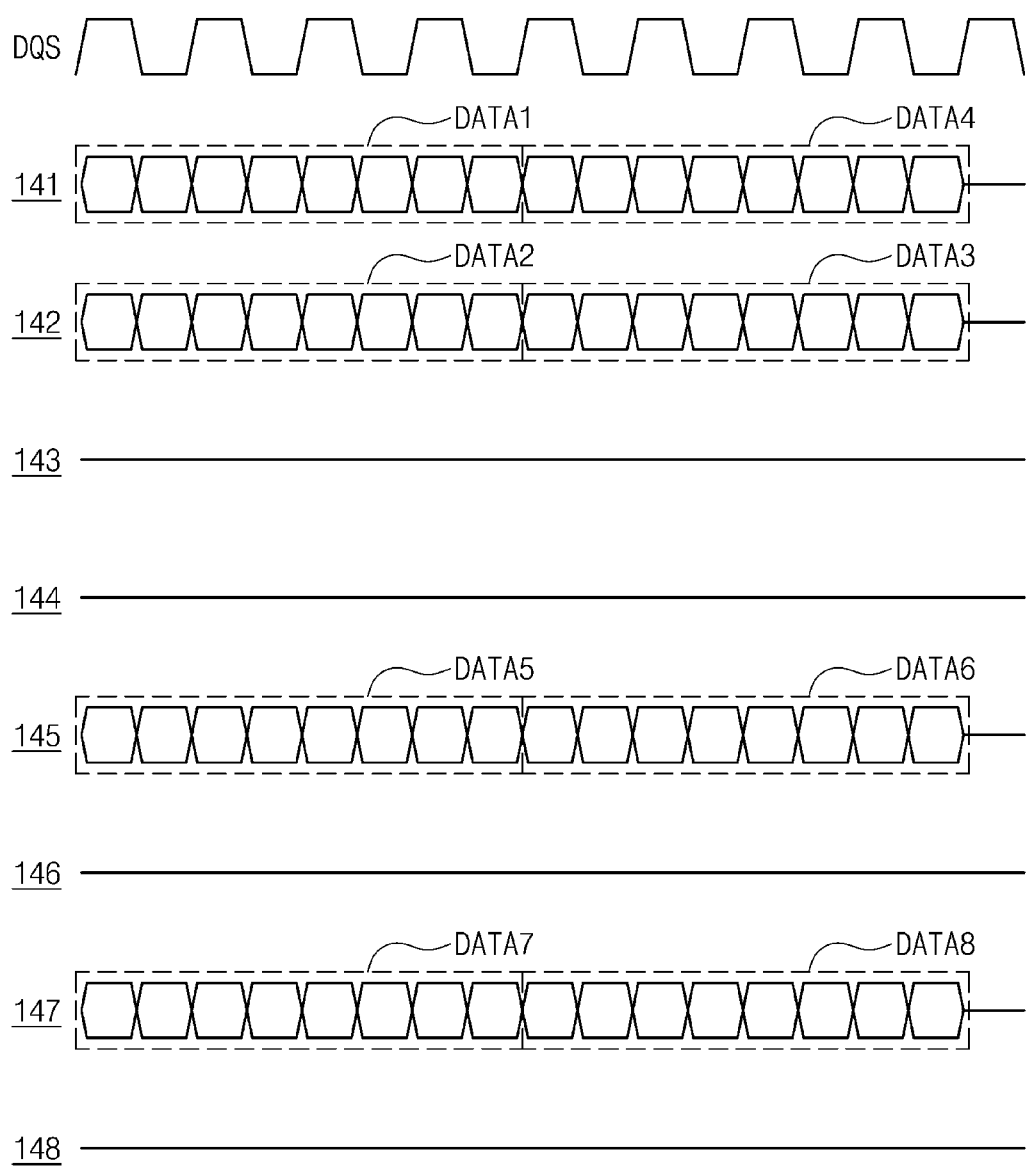
FIG. 14 illustrates a timing diagram of an example in which failover data buffers of FIG. 13 output first to eighth data.

FIG. 14 illustrates a timing diagram of an example in which failover data buffers of FIG. 13 output the first to eighth data DATA1 to DATA8. Referring to FIGS. 13 and 14, the first, second, fifth, and seventh data buffers 141, 142, 145, and 147 respectively output the first, second, fifth, and seventh data DATA1, DATA2, DATA5, and DATA7 at the same time.

Afterwards, the first, second, fifth, and seventh data buffers 141, 142, 145, and 147 respectively output the fourth, third, sixth, and eighth data DATA4, DATA3, DATA6, and DATA8 associated with the failed third and sixth data buffers 143 and 146 and the unused fourth and eighth data buffers 144 and 148 at the same time.

As described above, even though at least one of the data buffers 141 to 148 fails, the memory system 10 according to an embodiment of the inventive concepts may read data stored in the volatile memory device 110 or the nonvolatile memory device 120 through the failover operation. According to the failover operation, an error due to the failure of a data buffer is prevented. That is, during the failover operation, the controller 130 controls the semiconductor module 100a so that all of the data output from the volatile memory device 110 or the nonvolatile memory device 120 to the host device (i.e., external device) through the data buffers 141 to 148 are valid data.

Embodiments are above described whereby each of the failover data buffers first output data respectively associated with itself (i.e., data respectively associated or intended for the corresponding failover data buffers), and then output data associated with a respective failed data buffer or unused data buffer. However, the failover data buffers in other embodiments may be changed to output data associated with itself after outputting data associated with a failed data buffer or an unused data buffer.

According to an embodiment of the inventive concepts, when a data buffer fails, there is performed a failover operation in which data associated with a failed data buffer are accessed through another data buffer. Accordingly, it may be possible to prevent data stored in nonvolatile storage from being not read due to failure of a data buffer in a semiconductor memory module.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. A semiconductor memory module comprising:
a volatile memory device;
a nonvolatile memory device;
data buffers; and
a controller configured to output first data read from the volatile memory device or the nonvolatile memory device to an external device through the data buffers, and to write second data received from the external device through the data buffers in the volatile memory device or the nonvolatile memory device,
wherein the controller is configured to perform a failover operation based on a failover request that includes fail information indicating a position of a failed data buffer from among the data buffers, and
during the failover operation, the controller is configured to convey third data associated with the failed data buffer to the external device through a failover data buffer from among the data buffers.

2. The semiconductor memory module of claim 1, wherein during the failover operation, the controller is further configured to convey fourth data associated with the failover data buffer to the external device through the failover data buffer.

3. The semiconductor memory module of claim 1, wherein during the failover operation, the controller is configured to convey fourth data associated with a non-defective data buffer from among the data buffers to the external device through the non-defective data buffer.

4. The semiconductor memory module of claim 1, wherein the controller is configured to operate based on a command and a control signal received from the external device, and
wherein the failover request is received in a form of the command or the control signal.

5. The semiconductor memory module of claim 1, wherein during the failover operation, the controller is configured to
output fourth data which are associated with the failover data buffer, and the third data from the first data read from the nonvolatile memory device, to the external device through the failover data buffer, and
output fifth data, which are from the first data and which are associated with non-defective data buffers from among the data buffers, to the external device through the non-defective data buffers.

6. The semiconductor memory module of claim 5, wherein the third data and the fourth data are sequentially output through the failover data buffer.

7. The semiconductor memory module of claim 5, wherein during the failover operation, the controller is configured to output valid data from the nonvolatile memory device or the nonvolatile memory device to the external device through the data buffers.

8. The semiconductor memory module of claim 1, wherein the controller is configured to stop supplying power to the failed data buffer.

9. The semiconductor memory module of claim 1, wherein the fail information further comprises a position of the failover data buffer.

10. A semiconductor memory system comprising:
a semiconductor memory module; and
a memory controller configured to control the semiconductor memory module,
wherein the semiconductor memory module comprises
a volatile memory device,
a nonvolatile memory device,
data buffers, and
a controller configured to output first data read from the volatile memory device or the nonvolatile memory device to the memory controller through the data buffers, and to write second data received from the memory controller through the data buffers in the volatile memory device or the nonvolatile memory device,
wherein the memory controller is configured to determine when at least one data buffer from among the data buffers is a failed data buffer, and the controller is configured to perform a failover operation to bypass the failed data buffer.

11. The semiconductor memory system of claim 10, wherein the memory controller is configured to perform an error position search operation to detect the failed data buffer from among the data buffers.

12. The semiconductor memory system of claim 11, wherein during the error position search operation, the memory controller is configured to write third data in each of the data buffers, read fourth data from each of the data buffers, and compare the third data and the fourth data.

13. The semiconductor memory system of claim 12, wherein after comparing the third data and the fourth data, the memory controller is configured to change a data pattern of the third data to provide changed third data, write the changed third data in each of the data buffers, read fifth data from each of the data buffers, and compare the changed third data and the fifth data.

14. The semiconductor memory system of claim 13, wherein the memory controller is configured to determine a data buffer from among the data buffers, in which the third data and the fourth data are different from each other or in which the changed third data and the fifth data are different from each other, as the failed data buffer.

15. The semiconductor memory system of claim 10, wherein during the failover operation, the memory controller is configured to transmit to the controller a failover request in a form of a command or a control signal for requesting the failover operation.

16. The semiconductor memory system of claim 15, wherein the failover request comprises at least one of information about a position of the failed data buffer, and information about a position of a failover data buffer from among the data buffers and through which to bypass and convey data associated with the failed data buffer.

17. The semiconductor memory system of claim 10, wherein during the failover operation, the memory controller is configured to receive third data through non-defective data buffers from among the data buffers, and receive fourth data associated with the failed data buffer through a failover data buffer from among the data buffers to bypasses the failed data buffer, and
wherein the memory controller is configured to process the third data and the fourth data as one data group associated with the data buffers.

18. A semiconductor memory system comprising:
a semiconductor memory module comprising a volatile memory device, a nonvolatile memory device, data buffers and a controller; and
a memory controller configured to detect a failed data buffer from among the data buffers and to provide a failover request,
wherein the controller is configured to perform a failover operation comprising reading data from the volatile memory device or the nonvolatile memory device, and providing the data to the memory controller through a failover data buffer from among the data buffers and through non-defective data buffers from among the data buffers, responsive to the failover request, and
wherein the failover data buffer provides a bypass path for data associated with the failed data buffer.

19. The semiconductor memory system of claim 18, wherein during the failover operation, the controller is configured to sequentially convey to the memory controller through the failover data buffer the data associated with the failed data buffer and data associated with the failover data buffer.

20. The semiconductor memory system of claim 18, wherein during the failover operation, the controller is configured to convey data associated with non-defective data buffers to the memory controller through the non-defective data buffers.

* * * * *